United States Patent [19]

Wickson

[11] 4,266,148
[45] May 5, 1981

[54] FAST CLOSING SWITCH SYSTEM

[75] Inventor: Arthur K. Wickson, Palos Verdes Estates, Calif.

[73] Assignee: The Garrett Corporation, Los Angeles, Calif.

[21] Appl. No.: 951,809

[22] Filed: Oct. 16, 1978

[51] Int. Cl.³ .................. H03K 17/73; H03K 17/292; H03K 17/04
[52] U.S. Cl. ........................ 307/252 J; 307/252 W; 307/268; 328/67
[58] Field of Search .......... 307/252 J, 252 K, 252 W, 307/268; 328/67; 323/225 C

[56] References Cited

U.S. PATENT DOCUMENTS

| | | | |
|---|---|---|---|
| 3,386,027 | 5/1968 | Kilgore et al. | 307/252 L |
| 3,662,189 | 5/1972 | Robinson et al. | 328/67 X |
| 3,737,679 | 6/1973 | Cooper | 307/252 J |

Primary Examiner—John Zazworsky
Attorney, Agent, or Firm—Joel D. Talcott; Albert J. Miller

[57] ABSTRACT

A thyristor switch system completes a circuit with a much higher rate of current rise than a thyristor alone is capable of delivering. The invention limits the current through the load during the "priming" period of the thyristor that precedes the application of a high current pulse through the load.

18 Claims, 7 Drawing Figures

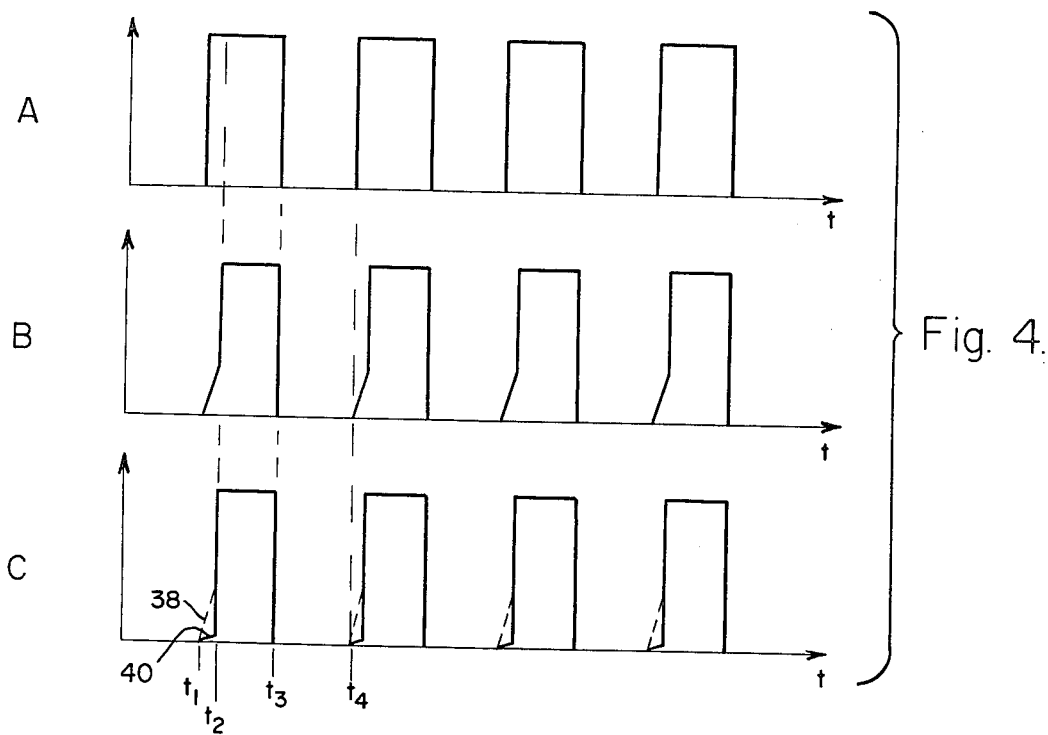
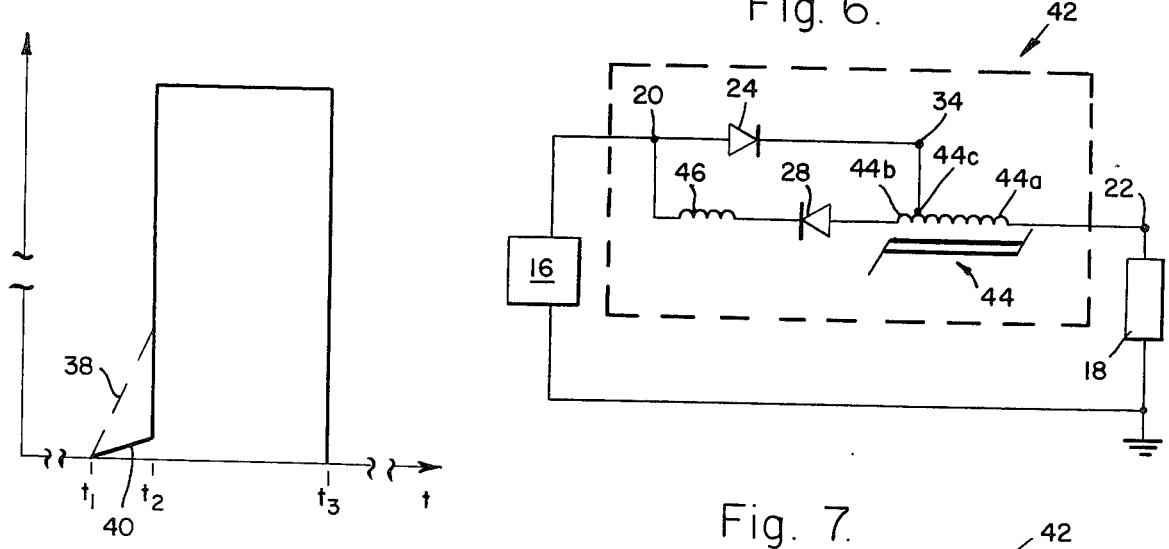

FAST CLOSING SWITCH SYSTEM

Thyristor devices, such as silicon controlled rectifiers (SCR's), are limited in the allowable rate of rise of current that can be passed immediately after the initial turn-on. This limitation results from the time required for the conductive channel in the SCR to enlarge. As the channel enlarges to cover the complete junction, the allowable safe current increases accordingly. The time required for the conduction to spread over the complete junction is typically 5 to 30 microseconds, and the rate of spread is a direct function of current density in the spreading channel. Thus, for the fastest turn-on of an SCR, the current should increase in a ramp function, and a typical limit on the rate of rise, in repetitive operation, is about 500 amp. per microsecond.

There are many applications, such as high power pulse generators, that require much higher rates of current rise. Other devices are usually used for these requirements, such as thyratrons, spark gaps, or SCR's in conjunction with saturable inductors. The latter combination causes a ramp function of current to flow through the SCR and the load until the full junction is ready for passing high current. At this time the inductor saturates and the current through the SCR and load increases at a much more rapid rate to the full rated current of the circuit.

This combination of SCR and saturable inductor is an accepted method of increasing the rate of current rise in prior art SCR circuits. However, in some applications such as lasers that are energized from pule forming networks (PFN's) it is required that the pulse current in the load increase sharply from nearly zero value, and hence in these applications the preliminary ramp function of current is not acceptable. Also, this period of current flow consumes and wastes energy from the PFN.

The preliminary ramp function of current and its associated disadvantages are essentially eliminated by the present invention.

The present invention relates to circuits utilizing switching means, such as a thyristor or SCR, for controlling the application of sharply defined pulse inputs from a pulse forming source to a load. A saturable reactor is connected in series with the thyristor to impede the current flow to the load. A large priming current is generated which circulates through the thyristor but not through the load to bring the thyristor, as rapidly as possible, to full conduction.

Prior to saturation of the reactor, circuit impedance is sufficiently great to prevent any significant current flow to the load. The saturable reactor is sized so that saturation occurs rapidly at approximately the same time as full current capability of the thyristor. Thus, a current pulse, as high as the maximum capability of the thyristor, passes to the load with an extremely rapid rate of rise.

An autotransformer is connected in the circuit so that its high voltage primary is in parallel with the saturable reactor while its low voltage secondary is in parallel with the thyristor. A diode is included in the secondary circuit to prevent continuous conduction from the source to the load. When the thyristor is gated on, a low voltage is induced in the secondary of the autotransformer, thus positively biasing the diode and causing a priming current to flow through the thyristor. The priming current is many times greater than the current that flows through the primary of the transformer and through the load circuit. The priming current causes the conduction of the junction to spread and reach the thyristor's maximum capability.

The advantages of the present invention will be more readily apparent when the following specification is read in conjunction with the appended drawings, wherein:

FIG. 4 is a series of graphical representations labelled A through C illustrating operating parameters of the circuit of FIG. 3;

FIG. 5 is an enlargement of one pulse of the graphical representation of FIG. 4C;

FIG. 6 is a schematic diagram of an alternate embodiment of the invention; and

FIG. 7 is a schematic diagram similar to FIG. 6 with the addition of a diode current trap.

DESCRIPTION OF THE PREFERRED EMBODIMENT

Figure 1:
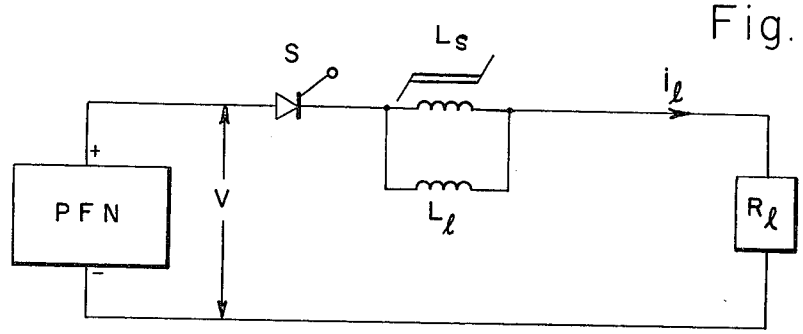
FIG. 1 is a schemtic diagram illustrating a prior art switch system.

Referring now to the drawings, FIG. 1 illustrates a prior art circuit utilized for applying a high current pulse $i_1$ from a pulse forming network (PFN) to a load $R_1$ without damage to thyristor S. To accomplish this, the parallel combination of inductors $L_1$ and saturable reactor Ls is interposed between the pulse forming network and the load.

Figure 2:
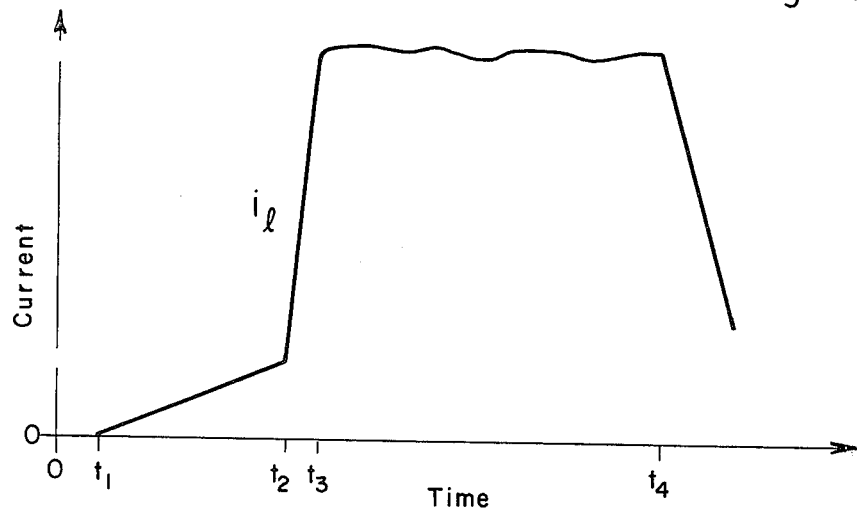
FIG. 2 is a graph of current vs. time for the prior art circuit of FIG. 1.

Operation of the circuit is illustrated in FIG. 2. The SCR S is turned on at time $t_1$. The current $i_1$ rises in a ramp function determined by $V/L_1$ between times $t_1$ and $t_2$. During this period the value of $L_s$ is much greater than $L_1$. While the current is increasing, the conduction area of the SCR junction is spreading so that by time $t_2$ the full junction is ready for passing high current. At time $t_2$ the inductor $L_s$ saturates and the value of $L_s$ becomes much less than $L_1$ and negligible compared with $R_1$. Hence between times $t_2$ and $t_3$ the current $i_1$ increases rapidly to a value determined by the loop impedance of the PFN and $R_1$.

This combination of SCR and saturable inductor is an accepted method of increasing the rate of current increase in any SCR circuit. However, in some applications it is required that the pulse current in the load increase sharply from nearly zero value, and hence in these applications the preliminary ramp function of current is not acceptable. Also, this period of current flow consumes and wastes energy from the PFN.

Figure 3:
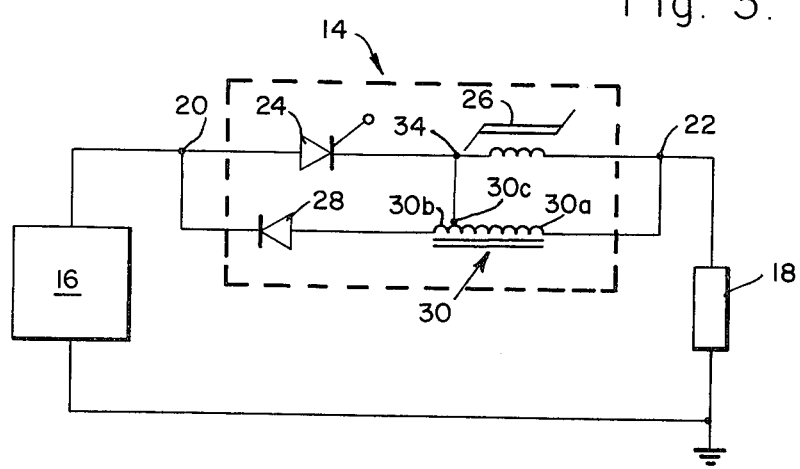
FIG. 3 is a schematic diagram of a preferred embodiment of the switch system of this invention.

The drawbacks of such prior art devices are overcome by the present invention. A switch system 14 in accordance with this invention is illustrated in FIG. 3 and is connected in series between the positive polarity of a pulse forming network 16 and a load 18 at junctions 20 and 22 respectively. The negative polarity of pulse forming network 16 and load 18 are connected to a common ground.

Switch system 14 comprises a thyristor 24, a saturable inductor 26, a diode 28, and a transformer 30. Thyristor 24 has its anode connected to junction 20 and its cathode connected to a junction 34. Saturable inductor 26 is connected between junction 34 and junction 22. A common terminal 30c of the transformer 30 is connected to junction 34 and an end terminal of primary winding 30a is connected to junction 22. A terminal of secondary winding 30b is connected to junction 20 through diode 28 which is poled with its cathode connected to terminal 20. The primary to secondary turns ratio of the transformer preferably has a value of about 100. When thyristor 24 is gated on, nearly all the voltage of the pulse forming network 16 appears across the combination of the saturable inductor 26 and the load 18. The initially high impedance of saturable inductor 26 limits the current flow to load 18.

Primary winding 30a is connected in parallel with saturable inductor 26 and a voltage across the winding induces a low voltage across secondary winding 30b. The low voltage induced in the secondary winding 30b forward biases diode 28 and causes a high priming current to flow through the path comprising secondary winding 30b, diode 28 and thyristor 24. Meanwhile a low current (approximately 1% of the priming current) flows through the load. As reactor 26 approaches saturation, the voltage drop between junctions 34 and 22 approaches zero, causing the voltage across primary winding 30a to approach zero. The voltage induced in secondary winding 30b approaches zero and the priming current ceases.

Through the proper sizing of reactor 26, its saturation takes place at a time subsequent to the full spread of conduction in the junction of thyristor 24 allowing a pulse of current to flow to load 18. This current pule flows to load 18 a discrete time period after thyristor 24 has been gated on. The rate of current rise is determined by the rate of saturation of the inductor and not by the thyristor.

FIG. 4 illustrates the relationships of various currents and voltages through four pulses from pulse forming network 16. A single pulse has been divided, for examination, into times $t_1$, $t_2$, and $t_3$. At time $t_1$, thyristor 24 is gated on and a low current flows from pulse forming network 16 through the switch system 14 and the load 18. At time $t_2$, thyristor 24 becomes fully conductive and saturable reactor 26 saturates, thus allowing the full current pulse from pulse forming network 16 to pass to load 18. At time $t_3$, the current from pulse forming network 16 ceases and all voltages and currents return to zero. At time $t_4$, the entire cycle is repeated.

FIG. 4A is a representation of the voltage at junction 34 to ground. A voltage pulse commences at time $t_1$ and terminates at time $t_3$. At time $t_4$, a second pulse commences, and the cycle repeats.

FIG. 4B illustrates the current flow through thyristor 24. At time $t_1$, thyristor 24 is gated on, and a low current flows from the pulse forming network 16 through the switch system 14 and through the load 18. The series impedance of inductor 26 prevents a high current from flowing to the load 18. However a high current flows within a low voltage internal loop comprising the secondary winding 30b, the diode 28, and the thyristor 24. The current flow depicted between times $t_1$ and $t_2$ represents the resulting priming current. The current flowing during this period causes the conductive channel to spread in the thyristor, allowing the thyristor 24 to carry its full current capability. At time $t_2$, the inductor 26 saturates and the thyristor 24 carries the full current pulse from network 16. At time $t_3$ the pulse returns to zero and thyristor 24 turns off. At time $t_4$, the cycle is repeated.

Fig. 4C, shown enlarged in FIG. 5, illustrates the current flow through load 18. Between times $t_1$ and $t_2$, a very slight current flows through load 18, approximately 1% of the priming current shown in the dotted line 38. It should be noted, however, this current flow in the load is much less than the current flow using prior art thyristor circuits such as the circuit of FIG. 1, which would be substantially the same as that shown as dotted line 38. At time $t_2$, thyristor 24 is fully conductive and inductor 26 saturates, allowing the full pulse current of network 16 to pass to load 18. At time $t_3$, the pulse returns to zero. At time $t_4$ the cycle is reported.

As can be seen more clearly in FIG. 5, prior art thyristor circuits (dotted line 38,) permit a higher current to flow to load 18 than the present invention (solid line 40) during priming of the thyristor. The increased current flow of the prior art circuits is undesirable for loads that need sharp rising current pulses. As can be seen in the foregoing graphical representations, a sharply defined current pulse, having an extremely high rate of rise, can be delivered to a load through a thyristor, even though the rate of rise of the pulse exceeds the design rate of rise of the thyristor.

FIG. 6 illustrates a modification of the system of FIG. 3 wherein the reference numerals of identical components have been retained. A switch system 42 is connected serially between pulse forming network 16 and load 18 and comprises thyristor 24, a saturable inductor 44, diode 28 and an inductor 46. Thyristor 24 has its anode connected to junction 20 and its cathode connected to junction 34. A common terminal 44c of saturable inductor 44 is connected to junction 34. Saturable inductor 44 has a primary winding 44a connected to junction 22 and a secondary winding 44b connected serially with diode 28 and inductor 46 to junction 20. Diode 28 is connected to block current flow from the pulse forming network 16 around thyristor 24.

This embodiment operates substantially in the same manner as the embodiment of FIG. 3. When thyristor 24 is gated on, a voltage drop occurs across junctions 34 and 22. This in turn induces a low voltage across secondary winding 44b. A priming current will flow around the loop comprising secondary winding 44b, diode 28, inductor 46 and thyristor 24. Inductor 46 is placed in the circuit to reduce the ramp rate of current rise in the priming current loop. When inductor 44 saturates, the voltage of primary and secondary windings reduces to zero. However, inductor 46 will still cause a slight priming current to flow through thyristor 24.

FIG. 7 illustrates the embodiment similar to that of FIG. 6 with the addition of a diode 48 connected in parallel with inductor 46 and poled in opposition to diode 28. The purpose of adding diode 48 is to eliminate the additional priming current from inductor 46 through thyristor 24 when the voltage drop across secondary winding 44b is reduced to zero. Diode 48 provides a closed loop for circulating and dissipating current from inductor 46 as soon as inductor 44 saturates.

As hs been shown, the present invention eliminates the problems associated with the use of a thyristor to supply current pulses having an extremely high rate of rise to load, thus vitiating the necessity of relying upon thyratrons or spark gaps to perform switching functions associated with sharply defined high current pulses. The present invention delays high current flow to the load until the junction of the thyristor has reached a condition of high conductivity, permitting the high current to flow to the load. Thus, the load sees a rate of rise far exceeding the rated value for the thyristor.

While specific embodiments of the invention have been illustrated and described, it is to be understood that the embodiments are by way of example only and that the invention is not to be construed as limited thereto, but only by the proper scope of the following claims.

I claim:

1. In combination:
   means for producing current pulse;
   load means;
   switching means;
   means for serially connecting said pulse producing means, said load means, and said switching means;
   impedance means operably connected with said switching means for delaying application of a substantial portion of said current pulse to said load means until a predetermined time period has elapsed; and
   priming means comprising transformer means having a primary winding connected in parallel with said impedance means and a secondary winding connected in parallel with said switching means for circulating a priming current through said switching means during said predetermined time period.

2. The combination of claim 1 wherein said switching means comprises a thyristor.

3. The combination of claim 1 wherein said impendance means comprises a saturable inductor serially connected with said switching means and said load means.

4. The combination of claim 1 additionally including unidirectional current conducting means connected in series with said secondary winding.

5. In combination:
   means for producing current pulse;
   load means;
   switching means;
   means for serially connecting said pulse producing means, said load means, and said switching means;
   impedance means operably connected with said switching means for delaying application of a substantial portion of said current pulse to said load means until a predetermined time period has elapsed;
   priming means for circulating a priming current through said switching means during said pedetermined time period; and
   a saturable inductor having a primary winding and a secondary winding and wherein said impedance means comprises said primary winding interposed serially between said switching means and said load means, and said priming means comprises said secondary winding connected in parallel with said switching means.

6. The combination of claim 5 additionally including unidirectional current conducting means connected in a series with said saturable inductor secondary winding for permitting current flow from said saturable inductor secondary winding to said switching means.

7. The combination of claim 6 additionally including inductor means connected in series with said unidirectional current conducting means.

8. The combination of claim 7 additionally including unidirectional current conducting means connected in parallel with said inductor means.

9. A circuit for conducting current pulses from a pulse forming source to a load, said circuit comprising:
   switching means connected between a load and a pulse forming source, said switching means having a fully conductive condition, a partially conductive condition and a non-conductive condition;
   a saturable inductor having a winding interposed between the switching means and the load for delaying application of a substantial portion of a current pulse from the pulse forming source to the load until said switching means is in said fully conductive condition; and
   means for circulating a priming current through said switching means while in said partially conductive condition, said priming means comprising:
   an autotransformer having a tap connected between said switching means and said saturable inductor, a primary winding connected in parallel with said saturable inductor, and a secondary winding connected in parallel with said switching means; and
   unidirectional current conducting means connected between said autotransformer secondary winding and said switching means to permit current flow from said transformer secondary winding through said switching means.

10. A circuit according to claim 9 including an additional winding on said saturable inductor wherein said priming means comprises
    said additional winding of said saturable inductor.

11. A circuit according to claim 10 including
    unidirectional current conducting means interposed between said additional winding and said switching means to permit said priming current to flow to said switching means.

12. A circuit according to claim 11 wherein said priming means additionally includes inductor means connected in series between said unidirectional current element and said switching means.

13. A circuit according to claim 12 including:
    unidirectional current conducting means connected in parallel with said inductor.

14. A circuit for controlling pulse flow in a system including a load and a network for forming a pulse, said circuit comprising:
    solid state switch means serially connected between the network and the load;
    a saturable inductor connected between said solid state switch means and the load to prevent application of a substantial portion of the pulse to the load until a predetermined time period has elapsed;
    an autotransformer having a tap connected between said solid state switch and said saturable inductor, and having a primary winding connected across said saturable inductor and a secondary winding for producing a priming current during said predetermined time period, said secondary winding being connected across said solid state switch means; and
    a unidirectional current element serially connected between said autotransformer secondary winding and said solid state switch means for permitting priming current flow to said solid state switch means.

15. A circuit for controlling pulse flow in a system having a load and a network for forming a pulse, said circuit comprising:
    solid state switch means serially connected between the network and the load; and
    a saturable inductor having a tap connected to said solid state switch means, and having a primary winding connected serially between said tap and said load for delaying the pulse until a predetermined time period has elapsed, and a secondary winding connected in parallel with said solid state switch means for circulation producing a priming current through said solid state switch means during said predetermined time period.

16. A circuit according to claim 15 including
inductor means serially connected between said saturable inductor secondary winding and said solid state switch means.

17. A circuit according to claim 16 including
a unidirectional current element serially connected between said inductor means and said saturable inductor secondary winding for permitting said priming current to flow to said solid state switch means.

18. A circuit according to claim 27 including
an additional unidirectional current element connected in parallel across said inductor means.

* * * * *